United States Patent
Kajitani et al.

(10) Patent No.: US 8,253,220 B2
(45) Date of Patent: Aug. 28, 2012

(54) NITRIDE SEMICONDUCTOR DEVICE AND METHOD FOR FABRICATING THE SAME

(75) Inventors: Ryo Kajitani, Osaka (JP); Satoshi Tamura, Osaka (JP); Hideki Kasugai, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/180,134

(22) Filed: Jul. 11, 2011

(65) Prior Publication Data
US 2011/0261853 A1 Oct. 27, 2011

Related U.S. Application Data (63) Continuation of application No. PCT/JP2009/006933, filed on Dec. 16, 2009.

(30) Foreign Application Priority Data

Jun. 15, 2009 (JP) .................................. 2009-141847

(51) Int. Cl.
*H01L 29/207* (2006.01)
*H01L 21/20* (2006.01)
(52) U.S. Cl. ........... 257/609; 257/E29.093; 257/E29.11; 257/E21.1; 438/508
(58) Field of Classification Search .................. 257/615, 257/609, 617, 655, E33.043, E29.091, E29.093, 257/E29.11, E21.09, E21.1; 438/508
See application file for complete search history.

(56) References Cited

U.S. PATENT DOCUMENTS

| | | | | |
|---|---|---|---|---|
| 6,303,405 B1 * | 10/2001 | Yoshida et al. | .................. | 438/46 |
| 6,498,111 B1 * | 12/2002 | Kapolnek et al. | ............. | 438/762 |
| 6,590,919 B1 | 7/2003 | Ueta | | |
| 2008/0144684 A1 * | 6/2008 | Tamura et al. | ........... | 372/45.011 |

FOREIGN PATENT DOCUMENTS

| | | |
|---|---|---|
| JP | 08-316462 | 11/1996 |
| JP | 11-261160 | 9/1999 |
| JP | 2003-229413 | 8/2003 |
| JP | 2005-038873 | 2/2005 |
| JP | 2006-019587 | 1/2006 |
| JP | 2008-159684 | 7/2008 |

OTHER PUBLICATIONS

Gao et al. "Dislocation- and crystallographic-dependent photoelectrochemical wet etching of gallium nitride." Applied Physiscs Letters, vol. 84, No. 17, Apr. 26, 2004, pp. 3322-3324.*
Youtsey et al. "Dopant-Selective Photoenhanced Wet Etching of GaN." J. Electronic Materials, vol. 27, No. 4, 1998, pp. 282-287.*

* cited by examiner

*Primary Examiner* — Wensing Kuo
(74) *Attorney, Agent, or Firm* — McDermott Will & Emery LLP (57) ABSTRACT

A nitride semiconductor device includes a first nitride semiconductor layer formed on a substrate, a defect induced layer formed on the first nitride semiconductor layer, and a second nitride semiconductor layer formed on the defect induced layer, contacting the defect induced layer, and having an opening through which the defect induced layer is exposed. The defect induced layer has a higher crystal defect density than those of the first and second nitride semiconductor layers.

15 Claims, 9 Drawing Sheets

NITRIDE SEMICONDUCTOR DEVICE AND METHOD FOR FABRICATING THE SAME

CROSS-REFERENCE TO RELATED APPLICATIONS

This is a continuation of PCT International Application PCT/JP2009/006933 filed on Dec. 16, 2009, which claims priority to Japanese Patent Application No. 2009-141847 filed on Jun. 15, 2009. The disclosures of these applications including the specifications, the drawings, and the claims are hereby incorporated by reference in their entirety.

BACKGROUND

The present disclosure relates to nitride semiconductor devices and methods for fabricating the nitride semiconductor devices. More particularly, the present disclosure relates to a nitride semiconductor device which requires a selective etching process and a method for fabricating the nitride semiconductor device.

Nitride semiconductors, such as gallium nitride (GaN), have a large band gap and therefore a large breakdown field strength and a high saturated drift velocity. Therefore, in recent years, nitride semiconductors have been widely studied and developed as materials for blue-violet semiconductor laser devices serving as light sources for recording and reproduction of high-density optical disks capable of high-density information recording and reproduction, materials for high frequency and high power semiconductor devices, etc. Nitride semiconductors belong to the same group III-V semiconductors including aluminum gallium arsenide (AlGaAs) used as a material for red laser devices, high-frequency semiconductor devices, etc., and indium gallium phosphide (InGaP) used as a material for infrared laser devices. However, nitride semiconductors have characteristics significantly different from those of AlGaAs and InGaP, and therefore, existing techniques are not directly applicable. Therefore, the fabrication of semiconductor devices made of nitride semiconductors suffers from low yield. Technological advances are desired which increase the yield of semiconductor devices made of nitride semiconductors.

The fabrication of semiconductor devices made of nitride semiconductors requires a selective etching process. For example, it is known that when a field effect transistor (FET) is formed by stacking a GaN layer and an AlGaN layer, a gate recess structure is formed by selectively etching a portion of the AlGaN layer in order to reduce a gate leakage current. In this case, it is necessary to selectively remove the AlGaN layer with high accuracy. Also, when a buried semiconductor laser device is formed of a nitride semiconductor, it is necessary to selectively remove a current confinement layer with high accuracy.

Dry etching is relatively easily performed on nitride semiconductors. However, dry etching has poor controllability of film thickness. Therefore, for example, when the gate recess structure is formed, it is difficult to accurately stop the etching process so that the AlGaN layer having a predetermined thickness is left. If dry etching reaches an interface between the AlGaN layer and the GaN layer, a channel which is a passage for electrons is not formed, so that the FET does not work. Also, if the amount of the remaining AlGaN layer varies, characteristics of the FET also varies. Moreover, dry etching has a drawback that a large amount of crystal defects are generated. These problems arise not only when the gate recess structure is formed, but also when a current path is formed in a buried semiconductor laser device.

On the other hand, wet etching advantageously has good controllability of film thickness, and is not substantially accompanied by crystal defects. Therefore, techniques of fabricating a blue-violet laser device by wet etching an amorphous or polycrystalline nitride semiconductor have been described (see, for example, Japanese Patent Publication No. H11-261160).

However, there is a problem that it is not easy to wet etch crystalline nitride semiconductor layers. Therefore, when it is necessary to process a crystalline nitride semiconductor layer, an amorphous or polycrystalline nitride semiconductor layer may be wet etched before crystallization by a thermal treatment. It is, however, difficult to obtain a nitride semiconductor layer having good crystallinity using such a technique. A technique of accurately processing a crystalline nitride semiconductor by direct wet etching is desired.

Even if wet etching is employed, perfect etch selectivity is not obtained, i.e., etching residue or overetching occurs. There is a demand for a technique of stopping etching accurately at an interface in order to improve the performance of a semiconductor device.

SUMMARY

The present disclosure provides implementations of a technique of stopping etching accurately at an interface of a nitride semiconductor, thereby providing an accurately processed nitride semiconductor device.

The nitride semiconductor device of the present disclosure includes a defect induced layer which has a higher crystal defect density than that of a nitride semiconductor layer to be etched.

Specifically, an example nitride semiconductor device includes a first nitride semiconductor layer formed on a substrate, a defect induced layer formed on the first nitride semiconductor layer, and a second nitride semiconductor layer formed on the defect induced layer, contacting the defect induced layer, and having an opening through which the defect induced layer is exposed. The defect induced layer has a higher crystal defect density than those of the first and second nitride semiconductor layers.

According to the example nitride semiconductor device, while positive holes are supplied and therefore photochemical etching proceeds in the second nitride semiconductor layer, positive holes are consumed by crystal defects and therefore photochemical etching does not proceed in the defect induced layer. Therefore, photochemical etching can be accurately stopped at an interface between the second nitride semiconductor layer and the defect induced layer. As a result, the fabrication accuracy and reproducibility of a nitride semiconductor device requiring a selective etching process can be significantly improved.

In the example nitride semiconductor device, the crystal defect density of the defect induced layer may be $2.9 \times 10^7$ defects/cm$^2$ or more, and the crystal defect density of the second nitride semiconductor layer may be $2.6 \times 10^7$ defects/cm$^2$ or less.

The example nitride semiconductor device may further include a δ-doped layer δ-doped with an impurity formed between the first nitride semiconductor layer and the defect induced layer. In this case, the δ-doped layer may contain silicon at a concentration of $1.3 \times 10^{19}$ atoms/cm$^3$ or more.

In the example nitride semiconductor device, the defect induced layer may contain an n-type impurity. In this case, the defect induced layer is preferably doped with Si at a concentration of $2 \times 10^{19}$ atoms/cm$^3$ or more, and the second nitride semiconductor layer is preferably doped with Si at a concentration of $4\times10^{18}$ atoms/cm$^3$ or less.

In the example nitride semiconductor device, the defect induced layer may contain a p-type impurity.

The example nitride semiconductor device may further include a third nitride semiconductor layer formed on the second nitride semiconductor layer, filling the opening. The first nitride semiconductor layer may include an active layer and a first p-type optical guide layer formed between the active layer and the defect induced layer. The second nitride semiconductor layer may be an n-type current blocking layer. The third nitride semiconductor layer may include a second p-type optical guide layer. The nitride semiconductor device may function as a semiconductor laser device.

With such a structure, a current injection portion can be accurately formed with high reproducibility. Therefore, the yield of a buried nitride semiconductor laser device can be significantly improved.

In the example nitride semiconductor device, the defect induced layer may have a thickness between 0.25 nm and 10 nm, inclusive. With such a structure, even if the defect induced layer is of n type, there is substantially no increase in the operating voltage of the device that is caused by the formation of the potential barrier.

The example nitride semiconductor device may further include a gate electrode formed on the defect induced layer in the opening, ohmic electrodes formed on both sides of the gate electrode, and a channel layer formed between the substrate and the first nitride semiconductor layer. The nitride semiconductor device may function as a transistor.

With such a structure, a gate recess structure can be accurately formed with high reproducibility. Therefore, a field effect transistor having a low gate leakage current and high power can be easily provided.

In the example nitride semiconductor device, the defect induced layer may have a thickness between 0.25 nm and 30 nm, inclusive. With such a structure, the defect induced layer has substantially no influence on the control of a current using a gate voltage.

An example method for fabricating a nitride semiconductor device includes the steps of (a) epitaxially growing a first nitride semiconductor layer on a substrate, (b) forming a defect induced layer on the first nitride semiconductor layer, (c) epitaxially growing a second nitride semiconductor layer on the defect induced layer, and (d) forming an opening through which the defect induced layer is exposed, by selectively photochemically etching the second nitride semiconductor layer. The defect induced layer has a higher crystal defect density than those of the first and second nitride semiconductor layers.

According to the example method, the defect induced layer having a higher crystal defect density than those of the first and second nitride semiconductor layers is formed, and the opening through which the defect induced layer is exposed is formed by photochemical etching. Therefore, photochemical etching can be accurately stopped at an interface between the second nitride semiconductor layer and the defect induced layer. As a result, the fabrication accuracy and reproducibility of a nitride semiconductor device requiring a selective etching process can be significantly improved.

In the example method, in step (b), the defect induced layer may be formed by performing the epitaxial growth while supplying an impurity. The amount of the impurity introduced into the defect induced layer may be greater than the amount of the impurity introduced into the second nitride semiconductor layer.

In this case, in step (b), silicon may be introduced into the defect induced layer at a concentration of $2\times10^{19}$ atoms/cm$^3$ or more, and in step (c), silicon may be introduced into the second nitride semiconductor layer at a concentration of $4\times10^{18}$ atoms/cm$^3$ or less.

The example method may further include the step of (e) after step (a) and before step (b), forming a δ-doped layer by supplying an impurity to a surface of the first nitride semiconductor layer. In step (b), the defect induced layer may be epitaxially grown on the δ-doped layer. Nanoholes are formed in a layer epitaxially grown on the impurity δ-doped layer during an initial stage of the growth, so that the crystal defect density of the layer increases. Therefore, the defect induced layer can be easily formed.

In the example method, in step (e), silicon is preferably introduced at a concentration of $1.3\times10^{19}$ atoms/cm$^3$ or more.

In the example method, in step (a), the first nitride semiconductor layer may be epitaxially grown by metal organic chemical vapor deposition at a predetermined growth temperature. In step (b), the defect induced layer may be formed in an upper portion of the first nitride semiconductor layer by interrupting supply of an organometallic material for epitaxially growing the first nitride semiconductor layer while the predetermined growth temperature is maintained. With such a method, the defect induced layer can be easily formed in an upper portion of the first nitride semiconductor layer.

According to the nitride semiconductor device of the present disclosure and the method for fabricating the nitride semiconductor device, the fabrication accuracy and reproducibility of a nitride semiconductor device requiring a selective etching process can be significantly improved.

DETAILED DESCRIPTION

Figure 1:
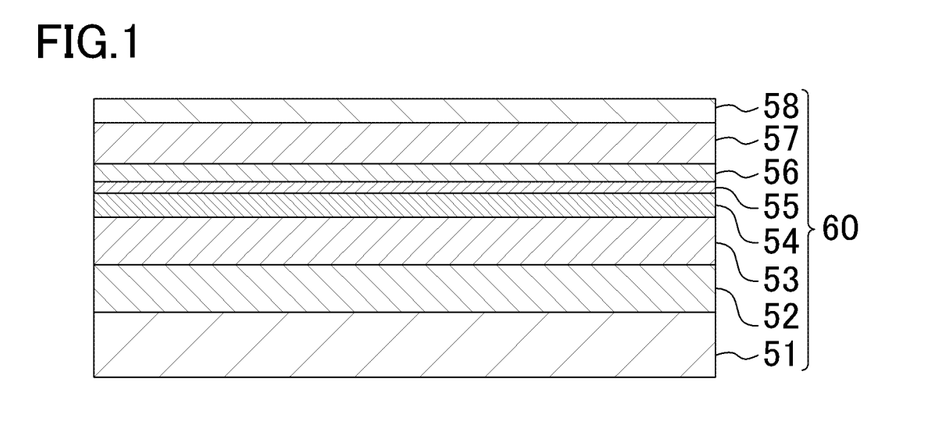
FIG. 1 is a cross-sectional view of a multilayer structure which was used to study photochemical etching.

Firstly, a technique of stopping etching at an interface more accurately than conventional techniques, which has been found by the present inventors, will be described. A multilayer structure 60 made of nitride semiconductors as shown in FIG. 1 was studied. In FIG. 1, the multilayer structure 60 included an n-GaN layer 52, an n-AlGaN layer 53, an n-GaN layer 54, an InGaN layer 55, a p-AlGaN layer 56, a p-GaN layer 57, and an n-AlGaN layer 58, which are successively formed on a substrate 51 made of gallium nitride (GaN). The mole fractions of Al and Ga in the n-AlGaN layer 58 were 0.15 and 0.85, respectively.

Figure 2:
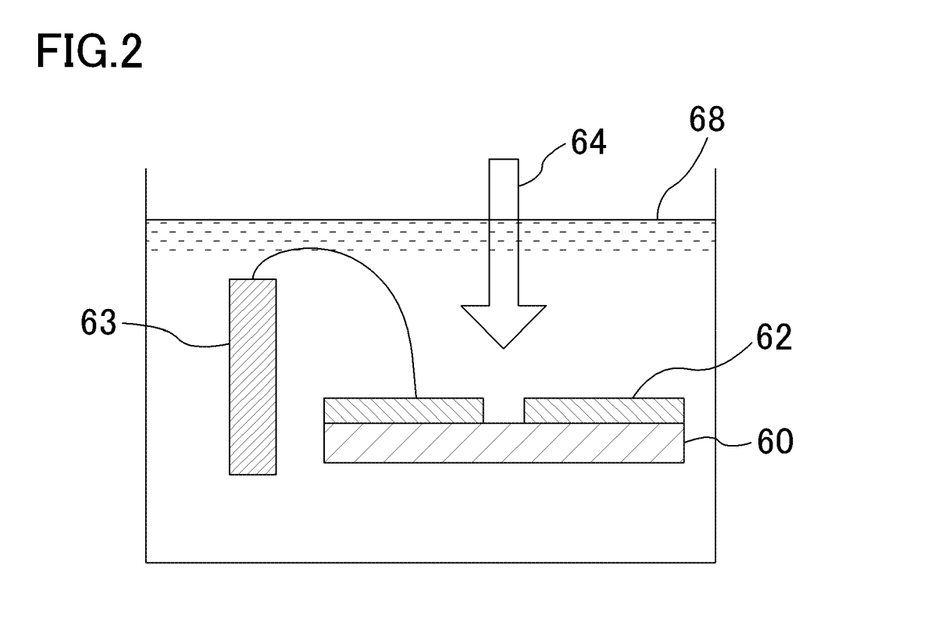
FIG. 2 is a schematic diagram showing photochemical etching of the multilayer structure.

Wet etching used here was photochemical etching as shown in FIG. 2. Photochemical etching is a type of wet etching which employs ultraviolet light and an alkali solution. Specifically, initially, the multilayer structure 60 on which a metal mask 62 having a stripe-shaped opening had been formed was immersed in 10 mol/L potassium hydroxide (KOH) solution 68 at a solution temperature of 20° C. After the metal mask 62 and a cathode 63 made of platinum etc. were connected together, the opening of the metal mask 62 was irradiated with ultraviolet light 64 having a shorter wavelength than that at the absorption edge of the n-AlGaN layer 58. Here, the ultraviolet light 64 had an intensity of about 65 mW/cm$^2$ at a wavelength of 405 nm. The ultraviolet light 64 may be emitted by a low-pressure ultraviolet lamp etc. The opening of the metal mask 62 was formed along the <1-100> crystal axis of the multilayer structure 60.

Figure 3:
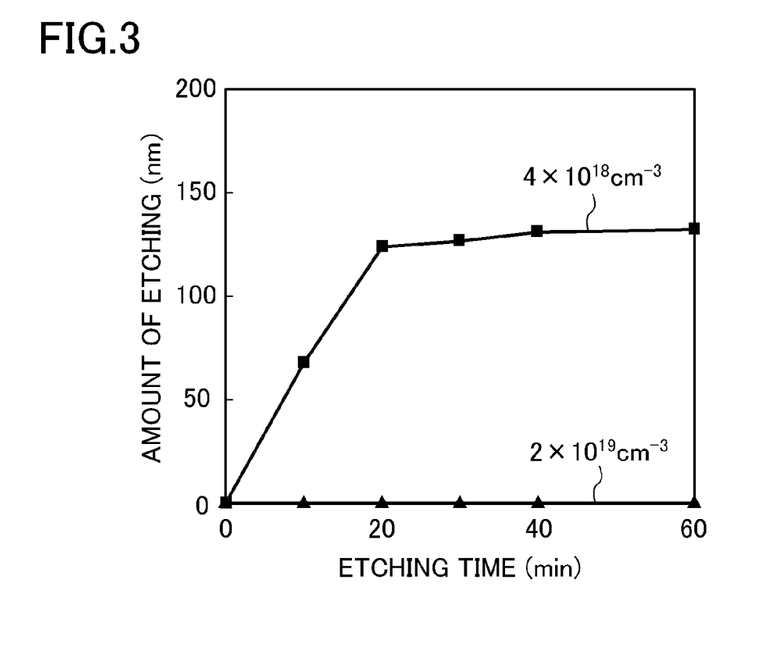
FIG. 3 is a graph showing an influence of the concentration of silicon on changes with time in the amount of etching.

The present inventors found that the etching behavior of the n-AlGaN layer 58 significantly varies depending on the amount of silicon (Si) contained in the n-AlGaN layer 58. FIG. 3 shows changes with time of the amount of etching when the n-AlGaN layer 58 was doped with Si at a concentration of $4\times10^{18}$ atoms/cm$^3$ and when the n-AlGaN layer 58 was doped with Si at a concentration of $2\times10^{19}$ atoms/cm$^3$. When the Si concentration was $4\times10^{18}$ atoms/cm$^3$, the amount of etching increases with time. When the Si concentration was $2\times10^{19}$ atoms/cm$^3$, etching did not occur.

When GaN is photochemically etched, the following reaction is considered to occur:

$$\text{GaN} + 6\text{OH}^- + 3h^+ \rightarrow \text{GaO}_3^- + 0.5\text{N}_2 + 3\text{H}_2\text{O} \quad (1)$$

As shown in Expression (1), positive holes are required for photochemical etching of nitride semiconductors. Positive holes are supplied by irradiating the nitride semiconductor with ultraviolet light. However, if the nitride semiconductor is excessively doped with Si, a large amount of crystal defects are formed, and positive holes generated by irradiation with ultraviolet light are consumed by nonradiative recombination. Therefore, a reason why photochemical etching did not occur when the concentration of doped Si in the n-AlGaN layer 58 was $2\times10^{19}$ atoms/cm$^3$ is considered to be that the amount of crystal defects generated was so large that positive holes required for the reaction were consumed.

The average density of crystal defects in the n-AlGaN layer 58 was estimated based on the half-width of a diffraction peak of X-ray diffraction (XRD). As a result, when the concentration of doped Si was $4\times10^{18}$ atoms/cm$^3$, the average crystal defect density was about $2.6\times10^7$ defects/cm$^2$. On the other hand, when the concentration of doped Si was $2\times10^{19}$ atoms/cm$^3$, the average crystal defect density was about $2.9\times10^7$ defects/cm$^2$. In view of this, it is considered that when the crystal defect density was about $2.6\times10^7$ defects/cm$^2$ or less, positive holes required for the reaction were supplied, and when the crystal defect density was about $2.9\times10^7$ defects/cm$^2$ or more, positive holes were consumed and therefore the etching reaction did not proceed.

According to this result, when a second layer having a crystal defect density of about $2.6\times10^7$ defects/cm$^2$ or less is stacked on a first layer having a crystal defect density of about $2.9\times10^7$ defects/cm$^2$ or more, the second layer is photochemically etched, but the first layer is not photochemically etched. In other words, photochemical etching can be accurately stopped at an interface between the first layer having a higher crystal defect density and the second layer having a lower crystal defect density.

The amount of positive holes generated can be varied depending on conditions for irradiation with ultraviolet light, etc. Therefore, if there is a relative difference in crystal defect density between the first and second layers, etching can be accurately stopped at an interface between the first and second layers. The crystal defect density at which the etching reaction does not occur is about 10% higher than the crystal defect density at which the etching reaction proceeds. Therefore, when the crystal defect density of the first layer is at least 10% higher than the crystal defect density of the second layer, photochemical etching can be accurately stopped at an interface between the first and second layers.

Specific embodiments of a semiconductor device which is fabricated under the conditions found by the present inventors that allow photochemical etching to be accurately stopped at the interface will be described hereinafter. Note that the embodiments described below are only for illustrative purposes, and the present disclosure is similarly applicable to various nitride semiconductor devices requiring a selective etching process.

First Embodiment

Figure 4:
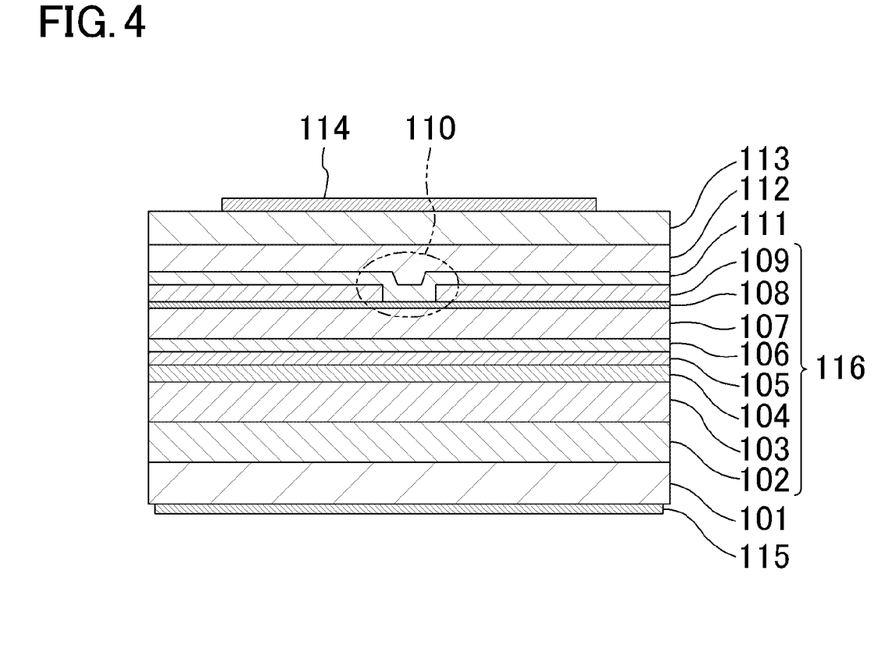
FIG. 4 is a cross-sectional view showing a semiconductor device according to a first embodiment.

FIG. 4 shows a cross-sectional structure of a nitride semiconductor device according to a first embodiment. FIGS. 5A-5D show a method for fabricating the nitride semiconductor device of the first embodiment in the order in which the device is fabricated. As shown in FIG. 4, the nitride semiconductor device of this embodiment is a buried semiconductor laser device. A defect induced layer 108 is formed between a first p-type optical guide layer 107 and a current blocking layer 109. By providing the defect induced layer 108, when the current blocking layer 109 is etched to form a current injection portion 110, overetching or underetching is substantially unlikely to occur.

Figure 5:
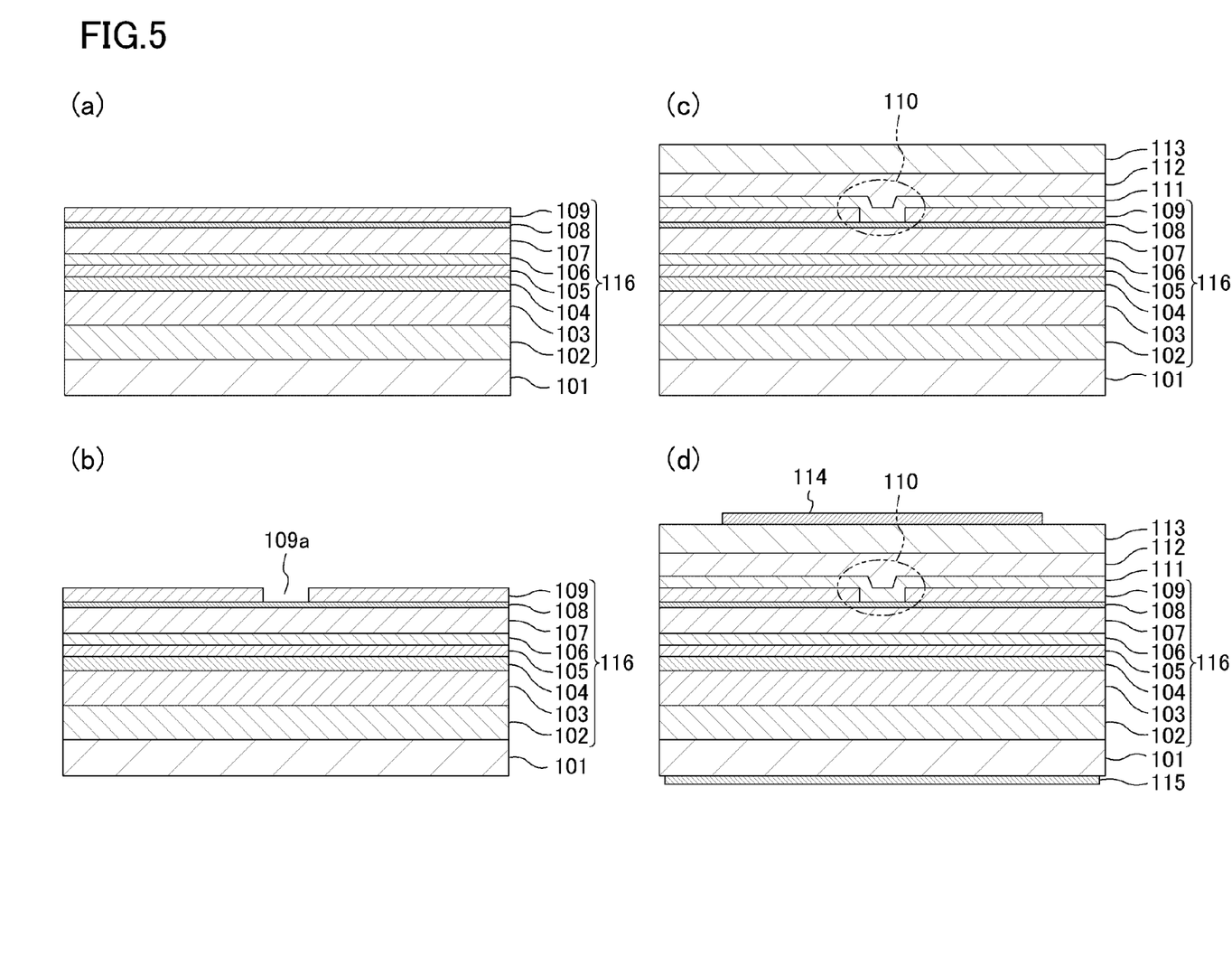
FIGS. 5A-5D are cross-sectional views showing the semiconductor device of the first embodiment in the order in which the device is fabricated.

The fabrication method will be specifically described. Initially, as shown in FIG. 5A, a multilayer structure 116 is formed on the main surface of a substrate 101 made of n-type gallium nitride (GaN) or aluminum gallium nitride (AlGaN) by metal organic chemical vapor deposition (MOCVD). The multilayer structure 116 includes an n-type GaN layer 102, an n-type cladding layer 103, an n-type optical guide layer 104, a quantum well active layer 105, a p-type electron barrier layer 106, the first p-type optical guide layer 107, the defect induced layer 108, and the current blocking layer 109, which are successively formed on the substrate 101.

As group III organometallic materials for MOCVD, trimethyl gallium (TMG), trimethyl aluminum (TMA), trimethyl indium (TMIn), etc. may be used. As group V materials, ammonia gas etc. may be used. As an n-type dopant, tetra ethyl silane (TESi) may be used. As a p-type dopant, bis (cyclopentadienyl)magnesium (Cp$_2$Mg) may be used.

The n-type GaN layer 102 may have a thickness of 2 μm. The n-type cladding layer 103 may, for example, be made of n-type Al$_{0.05}$Ga$_{0.95}$N and have a thickness of 1.6 μm. The n-type optical guide layer 104 may, for example, be made of n-type GaN and have a thickness of 150 nm. The quantum well active layer 105 may, for example, include a well layer which is made of In$_{0.10}$Ga$_{0.90}$N and has a thickness of 3 nm and a barrier layer which is made of In$_{0.02}$Ga$_{0.98}$N and has a thickness of 7.5 nm. The p-type electron barrier layer 106 may, for example, be made of p-type $Al_{0.16}Ga_{0.84}N$ and have a thickness of 10 nm. The first p-type optical guide layer 107 may, for example, be made of p-type GaN and have a thickness of 10 nm. The defect induced layer 108 may, for example, be made of $Al_{0.15}Ga_{0.85}N$ and have a thickness of 3 nm, and may be epitaxially grown and doped with Si at a concentration of $2\times10^{19}$ atoms/cm$^3$. The current blocking layer 109 may, for example, made of $Al_{0.15}Ga_{0.85}N$ and have a thickness of 125 nm, and may be epitaxially grown and doped with Si at a concentration of $4\times10^{18}$ atoms/cm$^3$.

Next, as shown in FIG. 5B, the current blocking layer 109 is selectively removed by photochemical etching to form an opening 109a. The crystal defect density of the defect induced layer 108 is about 10% higher than that of the current blocking layer 109. Therefore, photochemical etching stops at an interface between the current blocking layer 109 and the defect induced layer 108.

Photochemical etching is performed as follows. Initially, a metal mask having a stripe-shaped opening is formed on the current blocking layer 109. Thereafter, the multilayer structure 116 is immersed in an etching solution and irradiated with ultraviolet light while the metal mask is connected to a cathode. The opening of the metal mask may be formed along the <1-100> crystal axis of the multilayer structure 116. The etching solution may be 10 mol/L KOH solution, and the solution temperature may be 20° C. The ultraviolet light may have an emission intensity of about 65 mW/cm$^2$ at a wavelength of 405 nm.

Next, as shown in FIG. 5C, a second p-type optical guide layer 111, a p-type cladding layer 112, and a p-type contact layer 113 are successively formed on the current blocking layer 109 having the opening 109a by MOCVD. The second p-type optical guide layer 111 may, for example, be made of p-type GaN and have a thickness of 10 nm. The p-type cladding layer 112 may, for example, be made of p-type AlGaN and have a thickness of 40 nm. The p-type contact layer 113 may, for example, be made of p-type GaN and have a thickness of 40 nm. Thus, the current injection portion 110 is formed in the opening 109a.

Next, as shown in FIG. 5D, a p-side electrode 114 made of, for example, a multilayer film including nickel (Ni) and gold (Au) is formed on the p-type contact layer 113, and an n-side electrode 115 made of, for example, a multilayer film including titanium (Ti) and aluminum (Al) is formed on a surface (back surface) opposite to the n-type GaN layer 102 of the substrate 101. Note that the place where the n-side electrode 115 is provided is not limited to the back surface of the substrate 101. Alternatively, a portion of the multilayer structure 116 may be removed to expose the n-type semiconductor layer, and the n-side electrode 115 may be formed on the exposed n-type semiconductor layer. Thereafter, the wafer is divided into individual semiconductor devices by breaking, cleavage, etc.

The current blocking layer 109 needs to be thick enough to block a current. Therefore, the current blocking layer 109 preferably has a thickness of about 50 nm or more. If the current blocking layer 109 is excessively thick, a crack is likely to occur. Therefore, the thickness of the current blocking layer 109 is preferably about 500 nm or less.

If the defect induced layer 108 has at least the thickness of a monatomic layer, the defect induced layer 108 can stop photochemical etching. Therefore, the thickness of the defect induced layer 108 may be 0.25 nm or more. Note that as the thickness of the defect induced layer 108 increases, the efficiency of current injection decreases, and therefore, the thickness of the defect induced layer 108 is preferably 10 nm or less. When the thickness of the defect induced layer 108 is 10 nm or less, then even if the defect induced layer 108 is of n type, there is substantially no increase in the operating voltage of the device that is caused by the formation of the potential barrier.

In this embodiment, the defect induced layer 108 is formed by doping with Si to a concentration of $2\times10^{19}$ atoms/cm$^3$. As described above, however, the defect induced layer 108 only needs to has a crystal defect density which is about 10% higher than that of the current blocking layer 109, and may be doped with other n-type impurities instead of Si. Moreover, the defect induced layer 108 does not need to be of n type, and may be doped with a p-type impurity. The doping with the impurity may be achieved by introducing an organometallic material, such as TESi, Cp$_2$Mg, etc., other than group III elements during the epitaxial growth. A typical GaN substrate has a crystal defect density of about $5\times10^4$ defects/cm$^2$. Therefore, if the AlGaN layer is grown on the GaN substrate without doping with an impurity, the crystal defect density of the AlGaN layer is about $5\times10^5$ defects/cm$^2$ to about $5\times10^6$ defects/cm$^2$. Based on these values and the amount of doping in the current blocking layer 109, the amount of doping in the defect induced layer 108 may be determined.

Instead of introducing an impurity during the epitaxial growth, the crystal defect density may be increased by introducing an impurity by ion implantation etc. after the epitaxial growth. Moreover, instead of introducing an impurity, the crystal defect density of the semiconductor layer may be increased by dry etching or reevaporation after the semiconductor layer is epitaxially grown. Moreover, the crystal defect density may be varied by changing the growth temperature, the ratio of the amounts of the group V element and the group III element supplied, the pressure in the chamber during the epitaxial growth, etc. Therefore, the defect induced layer 108 may be formed by changing these parameters.

The mole fraction of the group III element in the defect induced layer 108 does not need to be equal to that in the current blocking layer 109. Therefore, the defect induced layer 108 may be made of GaN, AlN, etc., or alternatively, may be made of AlGaN having an Al mole fraction different from that in the current blocking layer 109. Still alternatively, the defect induced layer 108 may be made of any nitride semiconductor represented by $Al_xGa_yIn_{1-x-y}N$ ($0 \leq x \leq 1$, $0 \leq y \leq 1$, and $x+y \leq 1$).

(First Variation of First Embodiment)

In the first embodiment, the defect induced layer 108 is formed as a semiconductor layer which is epitaxially grown on the first p-type optical guide layer 107 by MOCVD and doped with an impurity at a high concentration. Alternatively, the defect induced layer 108 may be formed by the following method.

Figure 6:
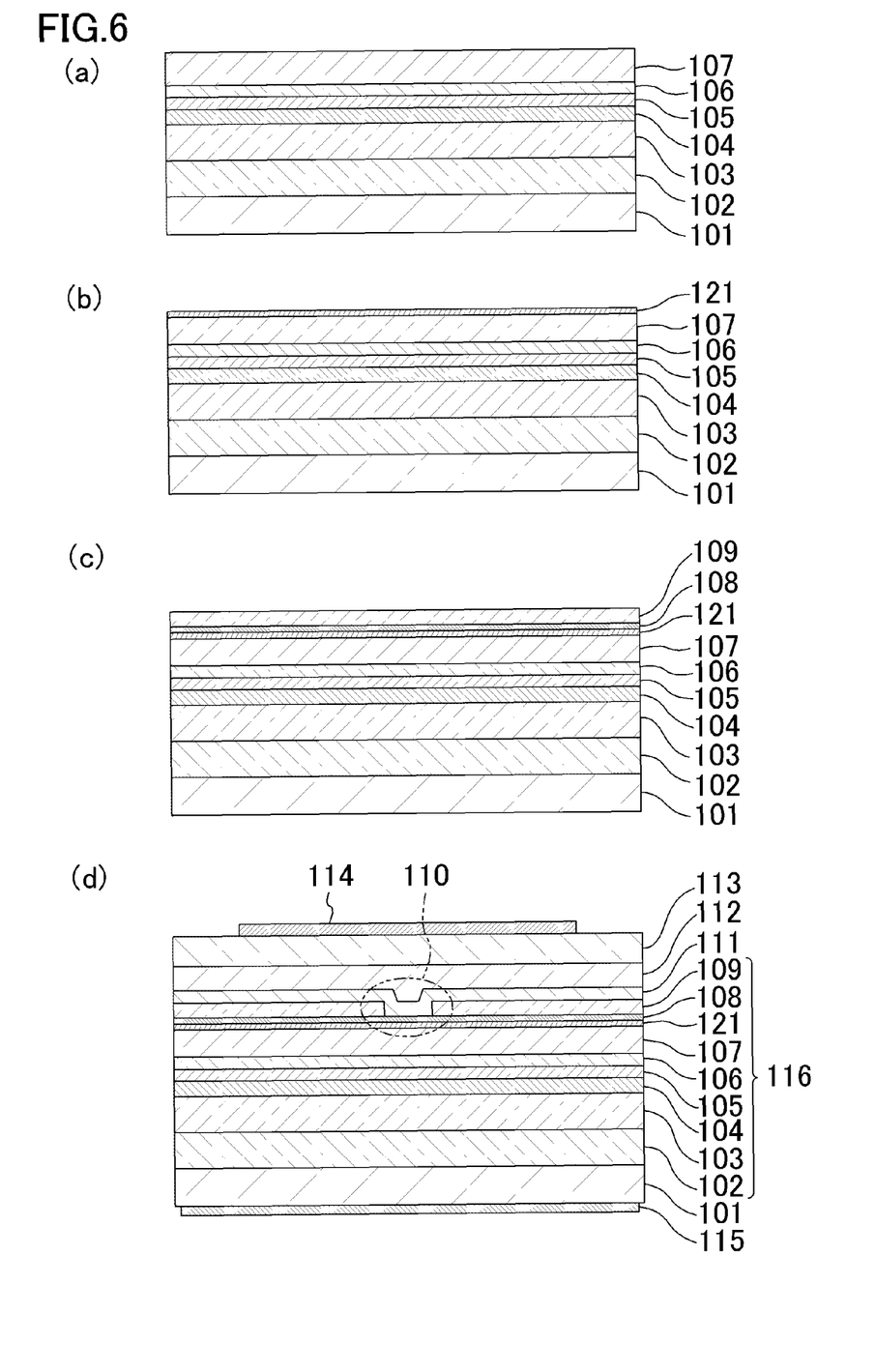
FIGS. 6A-6D are cross-sectional views showing a semiconductor device according to a first variation of the first embodiment in the order in which the device is fabricated.

As shown in FIG. 6A, the n-type GaN layer 102 to the first p-type optical guide layer 107 are epitaxially grown on the substrate 101 by MOCVD in a manner similar to that of the first embodiment.

Next, as shown in FIG. 6B, the epitaxial growth is temporarily interrupted, and TESi is supplied to a surface of the first p-type optical guide layer 107 to form a δ-doped layer 121 having a Si concentration of $1.3\times10^{19}$ atoms/cm$^3$ or more. In the δ-doped layer 121 containing Si, a Si—N bond is formed, so that the dangling bond of Si in the surface is terminated.

Next, for example, an n-type AlGaN layer is grown on the δ-doped layer 121. In this case, Ga, which is a group III element, is not adsorbed during an initial stage of the growth, and small holes (nanoholes) are formed, i.e., crystal defects occur. As the growth proceeds, the nanoholes are filled, so that the crystal defect density decreases. Therefore, as shown in FIG. 6C, the defect induced layer 108 having a thickness of about 3 nm and the current blocking layer 109 can be formed. The thickness of the defect induced layer 108 can be varied by changing the amount of the impurity in the δ-doped layer 121, the growth temperature and the ratio of the amounts of the group V element and the group III element supplied of the nitride semiconductor layer formed on the δ-doped layer 121, etc.

Thereafter, as in the first embodiment, photochemical etching of the current blocking layer 109, regrowth of the second p-type optical guide layer 111 etc., formation of electrodes, cleavage, etc. are performed to obtain a buried semiconductor laser device shown in FIG. 6D.

In this variation, the defect induced layer 108 and the current blocking layer 109 are continuously formed under the same growth conditions. Alternatively, the growth conditions may be changed partway through the growth process. For example, if the amount of Al supplied is large during the initial stage of the growth process and thereafter is reduced, the defect induced layer 108 and the current blocking layer 109 can have different Al mole fractions. Alternatively, if a p-type impurity is supplied during the initial stage of the growth process and thereafter is changed to an n-type impurity, the defect induced layer 108 of p-type and the current blocking layer 109 of n-type can be formed.

The δ-doped layer 121 may be doped with an impurity other than Si, or a p-type impurity, such as Mg etc.

(Second Variation of First Embodiment)

Figure 7:
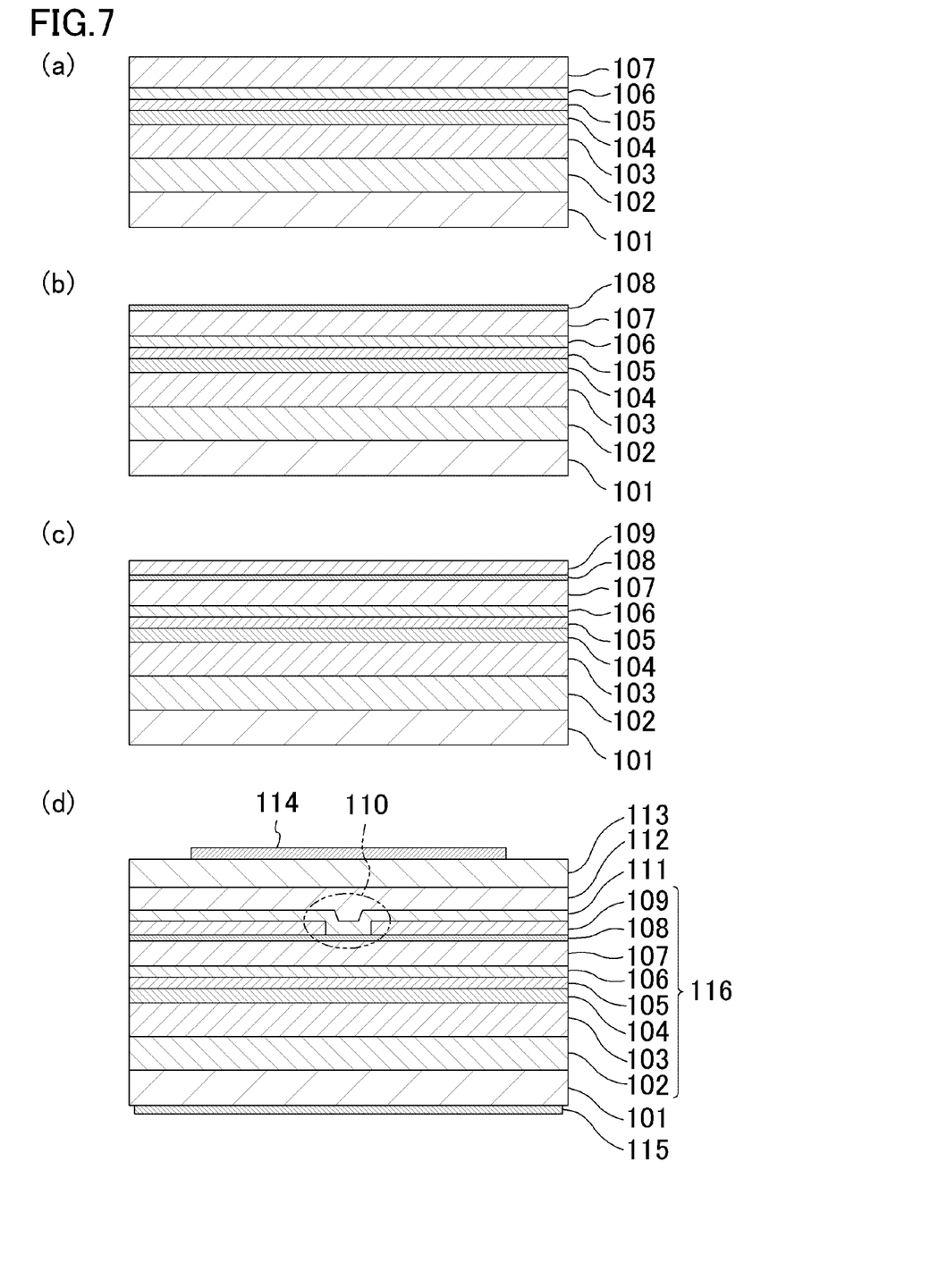
FIGS. 7A-7D are cross-sectional views showing a semiconductor device according to a second variation of the first embodiment in the order in which the device is fabricated.

The defect induced layer 108 may be formed as follows. Initially, as shown in FIG. 7A, the n-type GaN layer 102 to the first p-type optical guide layer 107 are epitaxially grown on the substrate 101 by MOCVD in a manner similar to that of the first embodiment. Next, the supply of the organometallic material is stopped while the growth temperature is maintained. As a result, a large amount of crystal defects are generated in the vicinity of a surface of the first p-type optical guide layer 107, so that the defect induced layer 108 having a thickness of several nanometers is formed as shown in FIG. 7B. Next, as shown in FIG. 7C, an organometallic material is supplied again to grow the current blocking layer 109. Thereafter, as in the first embodiment, photochemical etching of the current blocking layer 109, regrowth of the second p-type optical guide layer 111 etc., formation of electrodes, cleavage, etc. are performed to obtain a buried semiconductor laser device shown in FIG. 7D.

In the first embodiment and the variations, the substrate is made of GaN or AlGaN. Alternatively, the substrate may be made of SiC etc. Still alternatively, an insulating sapphire substrate etc. may be employed.

Second Embodiment

Figure 8:
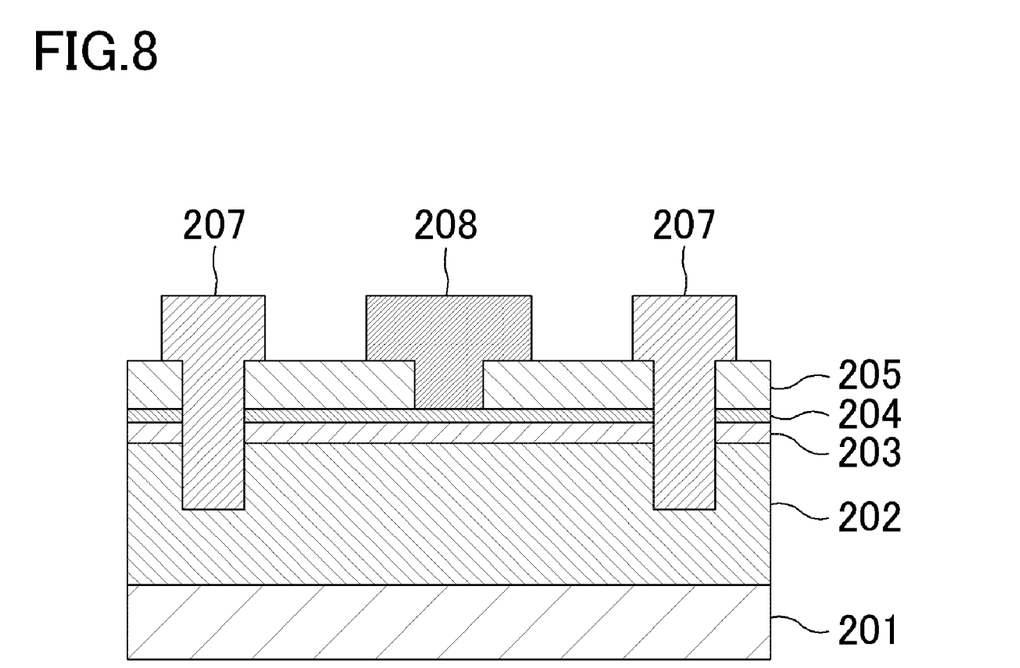
FIG. 8 is a cross-sectional view showing a semiconductor device according to a second embodiment.

A second embodiment of the present invention will be described with reference to the drawings. FIG. 8 shows a cross-sectional structure of a semiconductor device according to the second embodiment. FIGS. 9A-9D show a method for fabricating the semiconductor device of the second embodiment in the order in which the device is fabricated. As shown in FIG. 8, the nitride semiconductor device of the second embodiment is a field effect transistor (FET) having a gate recess structure. A first semiconductor layer 203, a defect induced layer 204, and a second semiconductor layer 205 are successively formed on a channel layer 202. By providing the defect induced layer 204 between the first semiconductor layer 203 and the second semiconductor layer 205, etching can be accurately stopped at an interface between the second semiconductor layer 205 and the defect induced layer 204. Therefore, the gate recess structure can be easily formed by selectively removing the second semiconductor layer 205.

Figure 9:
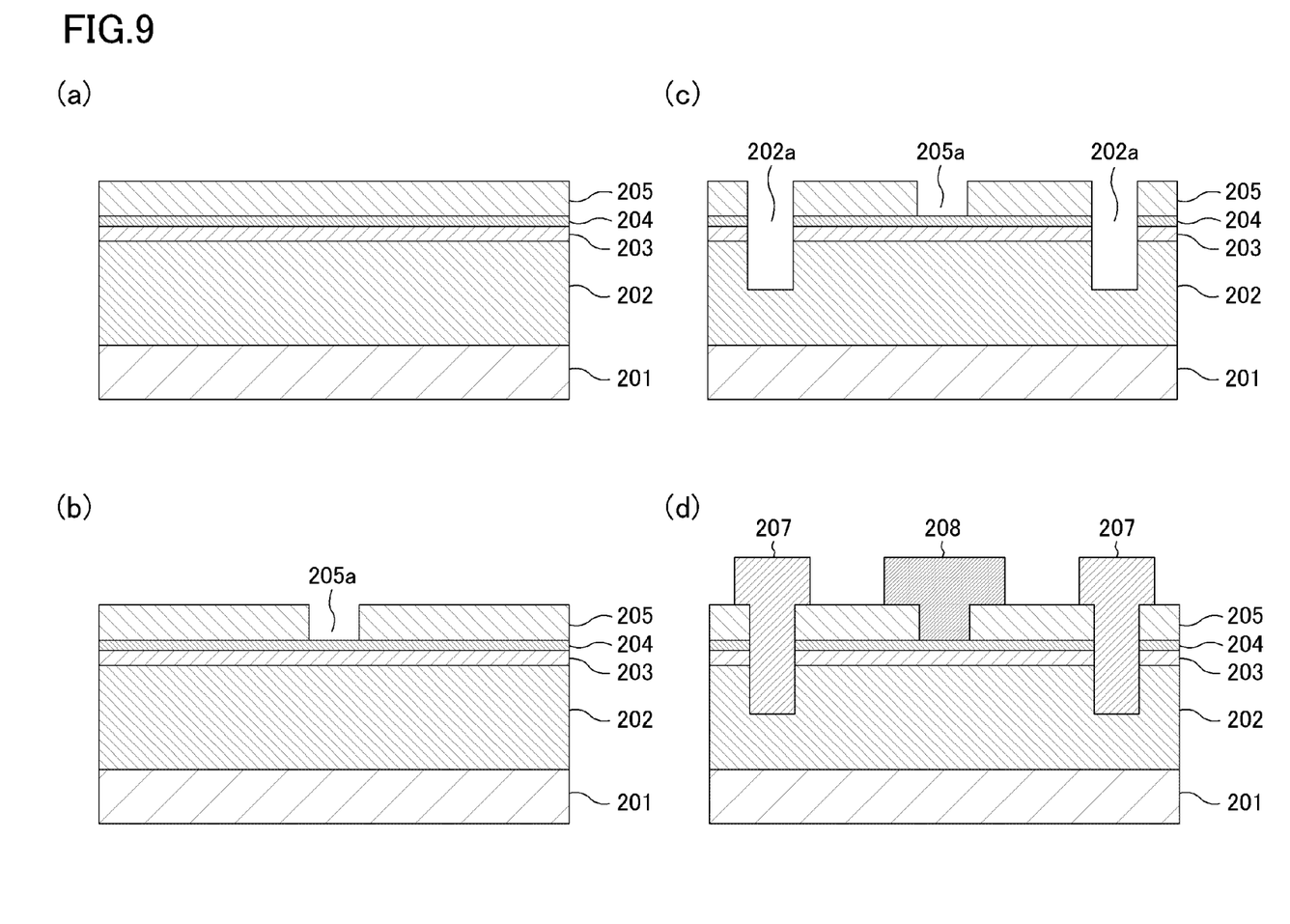
FIGS. 9A-9D are cross-sectional views showing a semiconductor device according to a second embodiment in the order in which the device is fabricated.

A method for fabricating the semiconductor device of this embodiment will be described. Initially, as shown in FIG. 9A, the channel layer 202, the first semiconductor layer 203, the defect induced layer 204, and the second semiconductor layer 205 are successively formed on a substrate 201 made of, for example, sapphire. The channel layer 202 may, for example, be made of GaN and have a thickness of 1 μm. The first semiconductor layer 203 may, for example, be made of $Al_{0.25}Ga_{0.75}N$ and have a thickness of 10 nm. The defect induced layer 204 may, for example, be made of $Al_{0.25}Ga_{0.75}N$ and have a thickness of 5 nm. The second semiconductor layer 205 may, for example, be made of $Al_{0.25}Ga_{0.75}N$ and have a thickness of 15 nm.

The defect induced layer 204 is formed so that the crystal defect density thereof is about 10% higher than that of the second semiconductor layer 205. Specifically, as in the first embodiment, an organometallic material, such as TESi, $Cp_2Mg$, etc., other than group III organometallic materials may be introduced during the epitaxial growth to degrade the crystallinity. Alternatively, instead of introducing an impurity during the epitaxial growth, the crystal defect density may be increased by introducing an impurity by ion implantation etc. after the epitaxial growth. Moreover, instead of introducing an impurity, the crystal defect density of the semiconductor layer may be increased by dry etching or reevaporation after the semiconductor layer is epitaxially grown. Moreover, the crystal defect density may be varied by changing the growth temperature, the ratio of the amounts of the group V element and the group III element supplied, the pressure in the chamber during the epitaxial growth, etc. Therefore, the defect induced layer 204 may be formed by changing these parameters.

Next, a metal mask is formed on the second semiconductor layer 205, and thereafter, the second semiconductor layer 205 is selectively removed by photochemical etching, to form an opening 205a as shown in FIG. 9B. The photochemical etching may be performed in a manner similar to that in the first embodiment. Specifically, the etching solution may be 10 mol/L KOH solution, the solution temperature may be 20° C., and the ultraviolet light may have an intensity of about 65 $mW/cm^2$ at a wavelength of 405 nm.

Next, as shown in FIG. 9C, openings 202a which reach deeper than an interface between the channel layer 202 and the first semiconductor layer 203 are provided on both sides of the opening 205a by dry etching.

Next, as shown in FIG. 9D, ohmic electrodes 207 serving as a source electrode and a drain electrode are formed in the openings 202a by electron beam deposition and lift-off, and a gate electrode 208 is formed in the opening 205a.

In this embodiment, the first semiconductor layer 203, the defect induced layer 204, and the second semiconductor layer 205 are made of $Al_{0.25}Ga_{0.75}N$. Alternatively, the first semiconductor layer 203, the defect induced layer 204, and the second semiconductor layer 205 may be made of any composition that can generate two-dimensional electron gas in the channel layer 202. The first semiconductor layer 203, the defect induced layer 204, and the second semiconductor layer 205 do not need to have the same composition, and may be made of any combination of nitride semiconductors represented by $Al_xGa_yIn_{1-x-y}N$ ($0 \leq x \leq 1$, $0 \leq y \leq 1$, and $x+y \leq 1$). The second semiconductor layer 205 may be undoped or doped with an n-type dopant. The first semiconductor layer 203 may be undoped or doped with an n-type dopant. The concentration of the two-dimensional electron gas can be caused to be higher when the first semiconductor layer 203 is doped with an n-type dopant.

If the defect induced layer 204 has at least the thickness of a monatomic layer, the defect induced layer 204 can stop photochemical etching. Therefore, the thickness of the defect induced layer 204 may be 0.25 nm or more. Note that as the thickness of the defect induced layer 204 increases, it is more difficult to control a current using a gate voltage, and therefore, the thickness of the defect induced layer 204 is preferably 30 nm or less.

(First Variation of Second Embodiment)

In the second embodiment, the defect induced layer 204 is formed as a semiconductor layer which is epitaxially grown on the first semiconductor layer 203 by MOCVD and doped with an impurity at a high concentration. Alternatively, the defect induced layer 204 may be formed by the following method.

Figure 10:
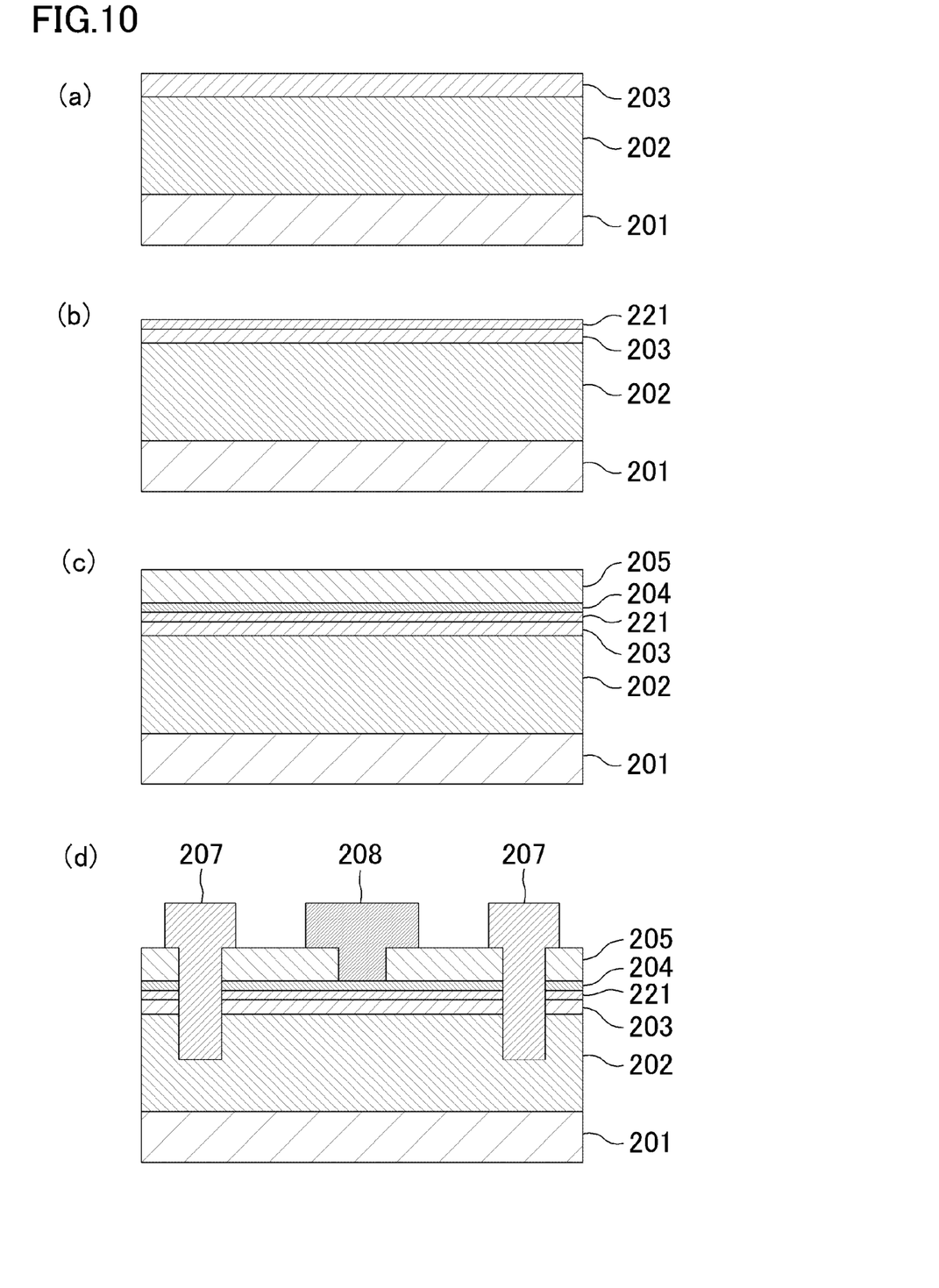
FIGS. 10A-10D are cross-sectional views showing a semiconductor device according to a first variation of the second embodiment in the order in which the device is fabricated.

As shown in FIG. 10A, the channel layer 202 to the first semiconductor layer 203 are epitaxially grown on the substrate 201 by MOCVD in a manner similar to that of the second embodiment.

Next, as shown in FIG. 10B, the epitaxial growth is temporarily interrupted, and TESi is supplied to a surface of the first semiconductor layer 203 to form a δ-doped layer 221 having a Si concentration of $1.3\times10^{19}$ atoms/cm$^3$ or more. In the δ-doped layer 221 containing Si, a Si—N bond is formed, so that the dangling bond of Si in the surface is terminated.

Next, for example, an AlGaN layer is grown on the δ-doped layer 221. In this case, Ga, which is a group III element, is not adsorbed during an initial stage of the growth, and small holes (nanoholes) are formed, i.e., crystal defects occur. As the growth proceeds, the nanoholes are filled, so that the crystal defect density decreases. Therefore, as shown in FIG. 10C, the defect induced layer 204 having a thickness of several nanometers is formed during the initial stage of the growth, and thereafter, the second semiconductor layer 205 is formed.

Thereafter, as in the second embodiment, photochemical etching of the second semiconductor layer 205, and formation of electrodes, are performed to obtain a FET shown in FIG. 10D.

In this variation, the defect induced layer 204 and the second semiconductor layer 205 are continuously formed under the same growth conditions. Alternatively, the growth conditions may be changed partway through the growth process. For example, if the amount of Al supplied is large during the initial stage of the growth process and thereafter is reduced, the defect induced layer 204 and the second semiconductor layer 205 can have different Al mole fractions. The δ-doped layer 221 may be doped with an impurity other than Si, or a p-type impurity, such as Mg etc.

(Second Variation of Second Embodiment)

Figure 11:
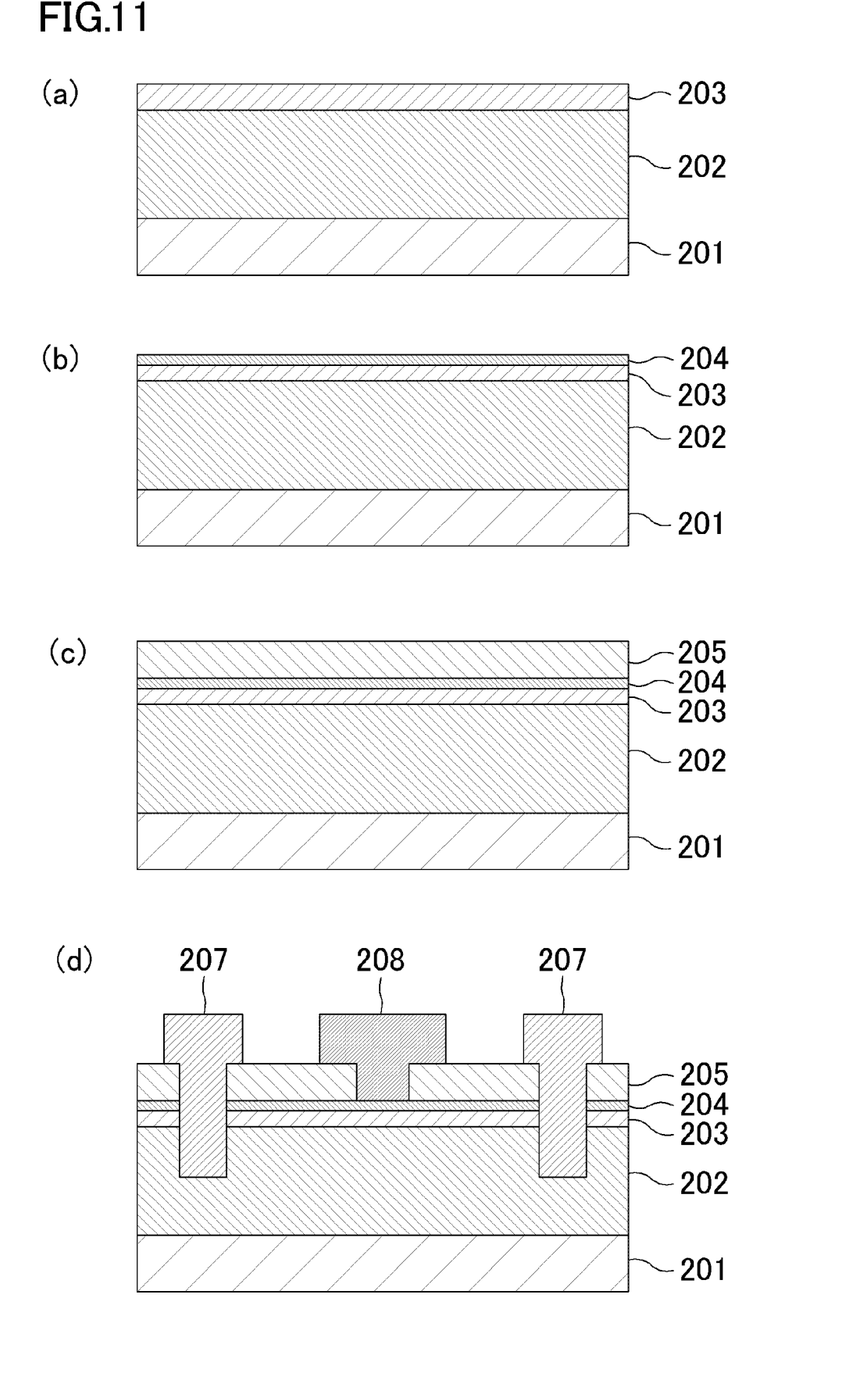
FIGS. 11A-11D are cross-sectional views showing a semiconductor device according to a second variation of the second embodiment in the order in which the device is fabricated.

The defect induced layer 204 may be formed as follows. Initially, as shown in FIG. 11A, the channel layer 202 to the first semiconductor layer 203 are epitaxially grown on the substrate 201 by MOCVD in a manner similar to that of the second embodiment. Next, the supply of the organometallic material is stopped while the growth temperature is maintained. As a result, a large amount of crystal defects are generated in the vicinity of a surface of the first semiconductor layer 203, so that the defect induced layer 204 having a thickness of several nanometers is formed as shown in FIG. 11B. Next, as shown in FIG. 11C, the second semiconductor layer 205 is grown. Thereafter, as in the second embodiment, photochemical etching of the second semiconductor layer 205, and formation of electrodes, are performed to obtain a FET shown in FIG. 11D.

In the second embodiment and the variations, the ohmic electrode 207 directly contacts the two-dimensional electron gas. Alternatively, any structure may be employed if an ohmic connection can be established between the ohmic electrode 207 and the two-dimensional electron gas. Also in the second embodiment and the variations, the gate electrode 208 directly contacts the defect induced layer 204. Alternatively, for example, a p-type GaN layer etc. may be formed in the recess portion, and the gate electrode 208 may be formed on the p-type layer. As a result, a normally-off FET can be easily obtained. In this case, the gate electrode 208 may be formed to make an ohmic contact with the p-type layer.

In the second embodiment and the variations, the substrate is made of sapphire. Alternatively, the substrate may be made of other materials, such as GaN, AlGaN, SiC, etc. In the second embodiment and the variations, a FET has been described. The present disclosure is also applicable to other nitride semiconductor devices requiring a selective etching process.

In the first and second embodiments and the variations, KOH is employed as an etching solution for photochemical etching. Alternatively, other alkaline solutions may be employed. The cathode may be made of a material having a higher ionization tendency than that of hydrogen.

According to the nitride semiconductor device of the present disclosure and the method for fabricating the nitride semiconductor device, the fabrication accuracy and reproducibility of nitride semiconductors can be improved compared to the conventional art. The present disclosure is particularly useful for nitride semiconductor devices requiring a selective etching process and methods for fabricating the nitride semiconductor devices.

What is claimed is:

1. A nitride semiconductor device comprising:
   a first nitride semiconductor layer formed on a substrate;
   a defect induced layer formed on the first nitride semiconductor layer;
   a second nitride semiconductor layer formed on the defect induced layer, contacting the defect induced layer, and having an opening through which the defect induced layer is exposed; and
   a δ-doped layer δ-doped with an impurity formed between the first nitride semiconductor layer and the defect induced layer,
   wherein the defect induced layer has a higher crystal defect density than those of the first and second nitride semiconductor layers.

2. The nitride semiconductor device of claim 1, wherein the crystal defect density of the defect induced layer is $2.9\times10^7$ defects/cm$^2$ or more, and the crystal defect density of the second nitride semiconductor layer is $2.6\times10^7$ defects/cm$^2$ or less.

3. The nitride semiconductor device of claim 1, wherein the δ-doped layer contains silicon at a concentration of $1.3\times10^{19}$ atoms/cm$^3$ or more.

4. The nitride semiconductor device of claim 1 wherein the defect induced layer contains an n-type impurity.

5. The nitride semiconductor device of claim 4, wherein the defect induced layer is doped with Si at a concentration of $2\times10^{19}$ atoms/cm$^3$ or more, and the second nitride semiconductor layer is doped with Si at a concentration of $4\times10^{18}$ atoms/cm$^3$ or less.

6. The nitride semiconductor device of claim 1, wherein the defect induced layer contains a p-type impurity.

7. The nitride semiconductor device of claim 1, further comprising:

a third nitride semiconductor layer formed on the second nitride semiconductor layer, filling the opening, wherein the first nitride semiconductor layer includes an active layer and a first p-type optical guide layer formed between the active layer and the defect induced layer, the second nitride semiconductor layer is an n-type current blocking layer, the third nitride semiconductor layer includes a second p-type optical guide layer, and the nitride semiconductor device functions as a semiconductor laser device.

8. The nitride semiconductor device of claim 7, wherein the defect induced layer has a thickness between 0.25 nm and 10 nm, inclusive.

9. A nitride semiconductor device comprising:

a first nitride semiconductor layer formed on a substrate;

a defect induced layer formed on the first nitride semiconductor layer;

a second nitride semiconductor layer formed on the defect induced layer, contacting the defect induced layer, and having an opening through which the defect induced layer is exposed;

a gate electrode formed on the defect induced layer in the opening;

ohmic electrodes formed on both sides of the gate electrode; and a channel layer formed between the substrate and the first nitride semiconductor layer, wherein:

the defect induced layer has a higher crystal defect density than those of the first and second nitride semiconductor layers, and the nitride semiconductor device functions as a transistor.

10. The nitride semiconductor device of claim 9, wherein the defect induced layer has a thickness between 0.25 nm and 30 nm, inclusive.

11. A method for fabricating a nitride semiconductor device, the method comprising steps of:

(a) epitaxially growing a first nitride semiconductor layer on a substrate;

(b) forming a defect induced layer on the first nitride semiconductor layer; and (c) epitaxially growing a second nitride semiconductor layer on the defect induced layer;

(d) forming an opening through which the defect induced layer is exposed, by selectively photochemically etching the second nitride semiconductor layer, and (e) after step (a) and before step (b), forming a δ-doped layer by supplying an impurity to a surface of the first nitride semiconductor layer, wherein:

in step (b), the defect induced layer is epitaxially grown on the δ-doped layer, and the defect induced layer has a higher crystal defect density than those of the first and second nitride semiconductor layers.

12. The method of claim 11, wherein in step (b), the defect induced layer is formed by performing the epitaxial growth while supplying an impurity, and the amount of the impurity introduced into the defect induced layer is greater than the amount of the impurity introduced into the second nitride semiconductor layer.

13. The method of claim 11, wherein in step (b), silicon is introduced into the defect induced layer at a concentration of $2\times10^{19}$ atoms/cm$^3$ or more, and in step (c), silicon is introduced into the second nitride semiconductor layer at a concentration of $4\times10^{18}$ atoms/cm$^3$ or less.

14. The method of claim 11, wherein in step (e), silicon is introduced at a concentration of $1.3\times10^{19}$ atoms/cm$^3$ or more.

15. The method of claim 11, wherein in step (a), the first nitride semiconductor layer is epitaxially grown by metal organic chemical vapor deposition at a predetermined growth temperature, and in step (b), the defect induced layer is formed in an upper portion of the first nitride semiconductor layer by interrupting supply of an organometallic material for epitaxially growing the first nitride semiconductor layer while the predetermined growth temperature is maintained.

* * * * *